(12) United States Patent
Newlin

(10) Patent No.: US 9,966,850 B2
(45) Date of Patent: *May 8, 2018

(54) HIGH SPEED TRI-LEVEL INPUT POWER CONVERTER GATE DRIVER

(71) Applicant: Silanna Asia Pte Ltd, Singapore (SG)

(72) Inventor: Trevor M. Newlin, Holly Springs, NC (US)

(73) Assignee: Silanna Asia Pte Ltd, Singapore (SG)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/651,938

(22) Filed: Jul. 17, 2017

(65) Prior Publication Data

US 2018/0062518 A1 Mar. 1, 2018

Related U.S. Application Data

(63) Continuation of application No. 15/250,531, filed on Aug. 29, 2016, now Pat. No. 9,712,058.

(51) Int. Cl.
| | |
|---|---|
| *H02M 1/08* | (2006.01) |
| *H02M 1/088* | (2006.01) |
| *H02M 1/096* | (2006.01) |
| *H02M 3/158* | (2006.01) |
| *H03K 17/687* | (2006.01) |
| *H03K 19/0175* | (2006.01) |

(52) U.S. Cl.
CPC .......... *H02M 3/158* (2013.01); *H03K 17/687* (2013.01); *H03K 19/017509* (2013.01)

(58) Field of Classification Search
CPC ........ H02M 1/08; H02M 1/088; H02M 1/096; H02M 3/158; H02M 3/1588
See application file for complete search history.

(56) References Cited

U.S. PATENT DOCUMENTS

| | | |
|---|---|---|
| 5,099,138 A | 3/1992 | Fukunaga |
| 5,408,150 A | 4/1995 | Wilcox |
| 6,211,706 B1 | 4/2001 | Choi et al. |
| (Continued) | | |

FOREIGN PATENT DOCUMENTS

WO 9301656 A1 1/1993

OTHER PUBLICATIONS

Notice of Allowance dated Mar. 24, 2017 for U.S. Appl. No. 15/250,531.
Office Action dated Nov. 10, 2016 for U.S. Appl. No. 15/250,531.

*Primary Examiner* — Timothy J Dole
*Assistant Examiner* — Sisay G Tiku
(74) *Attorney, Agent, or Firm* — The Mueller Law Office, P.C.

(57) ABSTRACT

Various methods and devices that involve electronic circuits are disclosed. A disclosed method includes buffering an input signal using a first buffer. The first buffer is powered by a supply voltage and a reference voltage. The method also includes buffering the input signal using a second buffer. The second buffer is powered by the reference voltage and a ground voltage. The method also includes level shifting a first buffer output signal of the first buffer to a voltage range using a first level shifter, and level shifting a second buffer output signal of the second buffer to the voltage range using a second level shifter. The voltage range is larger than a delta between the supply voltage and the reference voltage. The reference voltage is greater than one quarter of the supply voltage and less than three quarters of the supply voltage.

17 Claims, 7 Drawing Sheets

(56) References Cited

U.S. PATENT DOCUMENTS

| | | |
|---|---|---|
| 7,084,839 B2 | 8/2006 | Onozawa et al. |
| 2002/0125920 A1 | 9/2002 | Stanley |
| 2004/0061533 A1 | 4/2004 | Humphrey |
| 2006/0238527 A1 | 10/2006 | Walker et al. |
| 2007/0085589 A1 | 4/2007 | Yoshikawa |
| 2010/0271078 A1 | 10/2010 | Miller et al. |
| 2011/0309873 A1 | 12/2011 | Miller et al. |
| 2012/0092058 A1 | 4/2012 | Cooney et al. |
| 2012/0212262 A1 | 8/2012 | Clements |
| 2016/0079979 A1 | 3/2016 | Kinzer et al. |
| 2016/0134272 A1 | 5/2016 | Wang |

100

200

500

600

HIGH SPEED TRI-LEVEL INPUT POWER CONVERTER GATE DRIVER

CROSS-REFERENCE

The present application is a continuation of U.S. patent application Ser. No. 15/250,531, filed Aug. 29, 2016 and entitled "High Speed Tri-Level Input Power Converter Gate Driver," which is incorporated herein by reference.

BACKGROUND OF THE INVENTION

Electronic devices often need to generate multiple power regimes while only being powered by a single source. For example, a laptop computer may only have a single battery but may need to produce power regimes with different supply voltages for the various components on the laptop. Furthermore, regardless of the need for multiple power regimes, electronic devices often need to condition the power that is delivered to them from an external source. Returning to the example of a laptop, the laptop processor contains sensitive electronics and exhibits a widely varying power demand based on how hard the processor is working. Simply plugging in a DC version of the mains voltage source is not an option because the processor will not be shielded from dips or surges in the power supply and the power supply will likewise not be able to keep pace with the rapid transitions in the power drawn by the processor. The aforementioned requirements are addressed by power converters.

FIG. 1 provides a block diagram of an example power converter 100 regulating power applied to a load 101. In this example, the input is a voltage $V_{IN}$ provided on an input node of the power converter and the output is a voltage $V_{OUT}$ provided on an output node of the power converter. Alternative power converters may regulate an output current while allowing a voltage at the output node of the converter to vary. Power converter 100 regulates the load by altering the amount of power transferred through switching circuit 102 and output filter 103 using a control loop.

Switched mode converters are a specific class of power converters that utilize a control loop, switching circuit, and an output filter to control the transfer of power from the input regime to the output regime. In the illustrated example, switching circuit 102 is coupled to the input node, and serves to couple the input side of the power converter to the output side of the power converter. As illustrated, the control loop of power converter 100 includes a feedback path 104 that provides a control signal to switching circuit 102 that is based on a measurement taken from the output side of power converter 100. The feedback path includes signal conditioning and processing circuitry 105 and a driver circuit 106 for providing control signals to the power devices in switching circuit 102. For example, the driver circuit 106 could be a gate driver circuit for driving the gates of power transistors in switching circuit 102. The specific switching circuit illustrated by FIG. 1, in which the gates of two series-connected FETs are independently driven, is referred to as a totem pole or half-bridge switching circuit.

SUMMARY OF INVENTION

In one approach a control circuit is disclosed. The control circuit comprises a first buffer powered by a supply voltage and a reference voltage. The first buffer buffers a first input on a first output. The control circuit also comprises a second buffer powered by the reference voltage and a ground voltage. The second buffer buffers a second input on a second output. The control circuit also comprises a first level shifter. The first level shifter shifts the first output to a voltage range. The control circuit also comprises a second level shifter. The second level shifter shifts the second output to the voltage range. The voltage range is larger than a delta between the supply voltage and the reference voltage. The reference voltage is greater than one quarter of the supply voltage and less than three quarters of the supply voltage.

A power converter is disclosed. The power converter comprises a control loop that regulates an output of the power converter using a switching circuit. The switching circuit is coupled between an input side of the power converter and a load side of the power converter. The power converter also comprises a first buffer powered by a supply voltage and a reference voltage. The first buffer buffers a first input on a first output. The power converter also comprises a second buffer powered by the reference voltage and a ground voltage. The second buffer buffers a second input on a second output. The power converter also comprises a first level shifter. The first level shifter shifts the first output to a voltage range. The power converter also comprises a second level shifter. The second level shifter shifts the second output to the voltage range. The first level shifter and the second level shifter are on the control loop. The voltage range is larger than a delta between the supply voltage and the reference voltage. The reference voltage is greater than one quarter of the supply voltage and less than three quarters of the supply voltage.

Another method is disclosed. The disclosed method comprises buffering an input signal using a first buffer. The first buffer is powered by a supply voltage and a reference voltage. The method also comprises buffering the input signal using a second buffer. The second buffer is powered by the reference voltage and a ground voltage. The method also comprises level shifting a first buffer output signal of the first buffer to a voltage range using a first level shifter, and level shifting a second buffer output signal of the second buffer to the voltage range using a second level shifter. The voltage range is larger than a delta between the supply voltage and the reference voltage. The reference voltage is greater than one quarter of the supply voltage and less than three quarters of the supply voltage

DETAILED DESCRIPTION OF THE EMBODIMENTS

Reference now will be made in detail to embodiments of the disclosed invention, one or more examples of which are illustrated in the accompanying drawings. Each example is provided by way of explanation of the present technology, not as a limitation of the present technology. In fact, it will be apparent to those skilled in the art that modifications and variations can be made in the present technology without departing from the scope thereof. For instance, features illustrated or described as part of one embodiment may be used with another embodiment to yield a still further embodiment. Thus, it is intended that the present subject matter covers all such modifications and variations within the scope of the appended claims and their equivalents.

The switching circuit of a switched power converter deals with large system-level currents and relatively large voltages. Switching circuits that include two devices in series between the input and ground of the power converter, such as half or full bridge switching circuits, must be carefully designed to avoid situations in which both devices are turned on at the same time to create what is known as a cross-bar current. In these devices, the two series connected switches have only three valid operating modes during standard operation (i.e., on/off, off/on, and off/off). At a high level, the on/off and off/on states control when power is being transferred to the output filter or removed from the output filter. The off/off state is referred to herein as the tristate. Tristate is utilized in certain circumstances, such as when the power converter should not be transferring power to the output filter, and the output filter is not storing any power that can be transferred to the load. Different portions of the power converter may need to be alerted when the device enters tristate. As such a status signal may need to be generated by the same control circuitry that initiates tristate.

Figure 1:
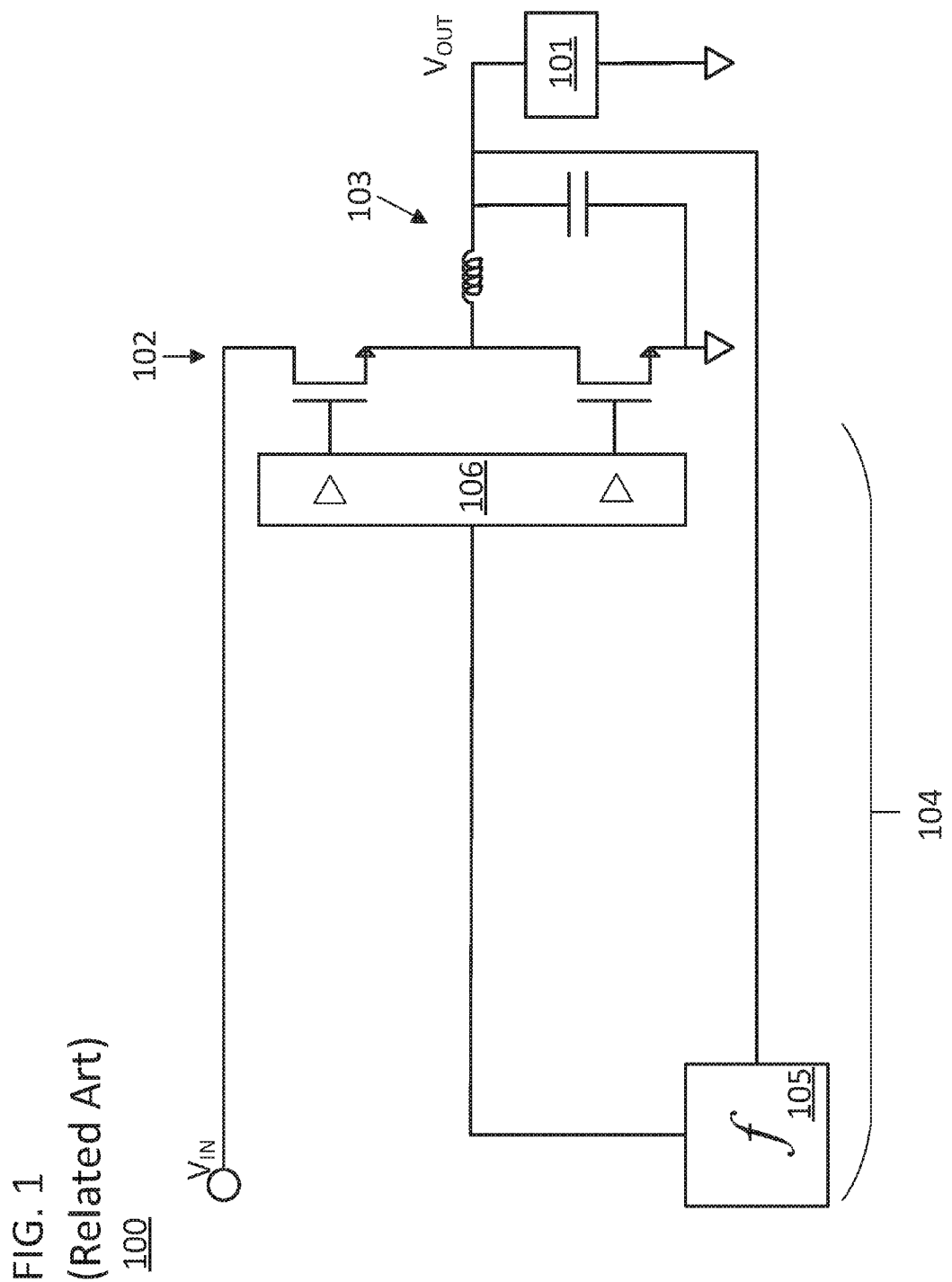
FIG. 1 is a block diagram of a power converter topology.
Figure 2:
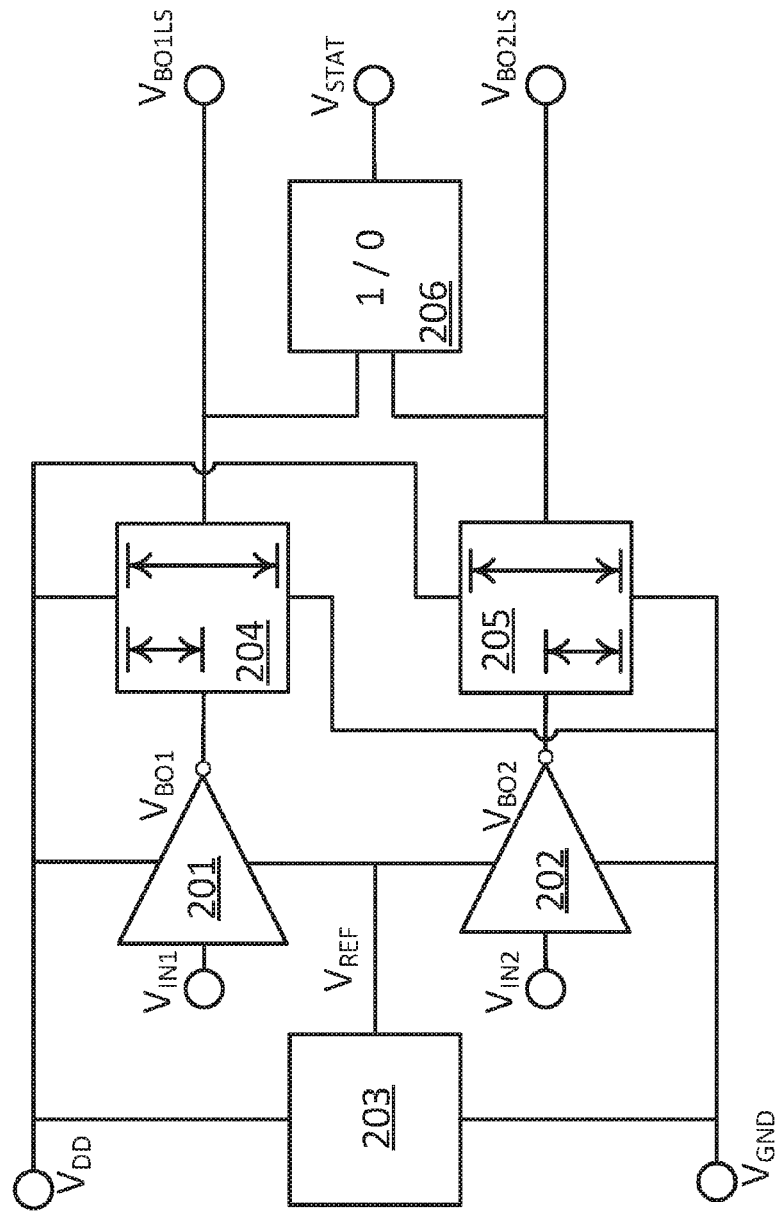
FIG. 2 is a block diagram of a control circuit that is in accordance with embodiments of the present invention.

FIG. 2 illustrates a control circuit 200. The control circuit includes a first buffer 201 coupled to a supply voltage $V_{DD}$ and a reference voltage $V_{REF}$. The first buffer is powered by these voltages. The first buffer 201 buffers a first input $V_{IN1}$ on a first output $V_{BO1}$. The control circuit also includes a second buffer 202 coupled to the reference voltage $V_{REF}$ and the ground voltage $V_{GND}$. The second buffer is powered by these voltages. The second buffer 202 buffers a second input $V_{IN2}$ on a second output $V_{BO2}$. The supply voltage $V_{DD}$ can be a supply voltage for the control loop of the power converter, and specifically can be a supply voltage for a digital portion of the control loop of the power converter. The supply voltage $V_{DD}$ can be in the range of 3.3-5 volts. The reference voltage $V_{REF}$ can be generated by a reference voltage generator 203 that is coupled to the supply voltage $V_{DD}$ and ground voltage $V_{GND}$. The reference voltage $V_{REF}$ can be generated from $V_{DD}$ using a voltage divider.

The first and second buffers 201 and 202 can be inverters. The inverters can be two-device complementary field effect transistor (FET) inverters designed to trip at approximately half their supply voltages. As such, first buffer 201 may trip at one half of a delta between the supply voltage $V_{DD}$ and the reference voltage $V_{REF}$, and second buffer 202 may trip at one half of a delta between the reference voltage $V_{REF}$ and the ground voltage $V_{GND}$. The reference voltage can be in the range of one quarter of the supply voltage to three quarters of the supply voltage. In particular, the reference voltage can be approximately one half of $V_{DD}$. In this particular situation, if the first and second buffers are inverters that are designed to trip at half of a delta between their supply voltages, first buffer 201 could trip when its input was equal to three quarters of the supply voltage $V_{DD}$, and the second buffer 202 could trip when its input was equal to one quarter of the supply voltage $V_{DD}$.

Control circuit 200 also includes a first level shifter 204 that shifts the first output voltage $V_{BO1}$ to a voltage range, and a second level shifter 205 that shifts the second output voltage $V_{BO2}$ to that same voltage range. The signal $V_{BO1LS}$ is the signal $V_{BO1}$ after being level shifted. The signal $V_{BO2LS}$ is the signal $V_{BO2}$ after being level shifted. The voltage range to which the signals are shifted is larger than a delta between the supply voltage $V_{DD}$ and the reference voltage $V_{REF}$. As illustrated, first level shifter 204 and second level shifter 205 are both coupled to and powered by supply voltage $V_{DD}$ and ground voltage $V_{GND}$. In specific implementations, the shifted signals will be shifted out to a range of $V_{GND}$ to $V_{DD}$ where $V_{BO1}$ is shifted out in the negative direction towards $V_{GND}$, and $V_{BO2}$ is shifted out in the positive direction towards $V_{DD}$. The signals $V_{BO1LS}$ and $V_{BO2LS}$ can be referred to as the high side control circuit output and low side control circuit output respectively. The outputs of the level shifters can be combined by a logic circuit 206 to generate a status signal $V_{STAT}$. The status signal can hold a true value when the outputs $V_{BO1LS}$ and $V_{BO2LS}$ both hold false values. For example, logic circuit 206 could comprise a NOR circuit or an equivalent logic circuit such as two inverters each independently in series with a common NAND circuit.

Figure 3:
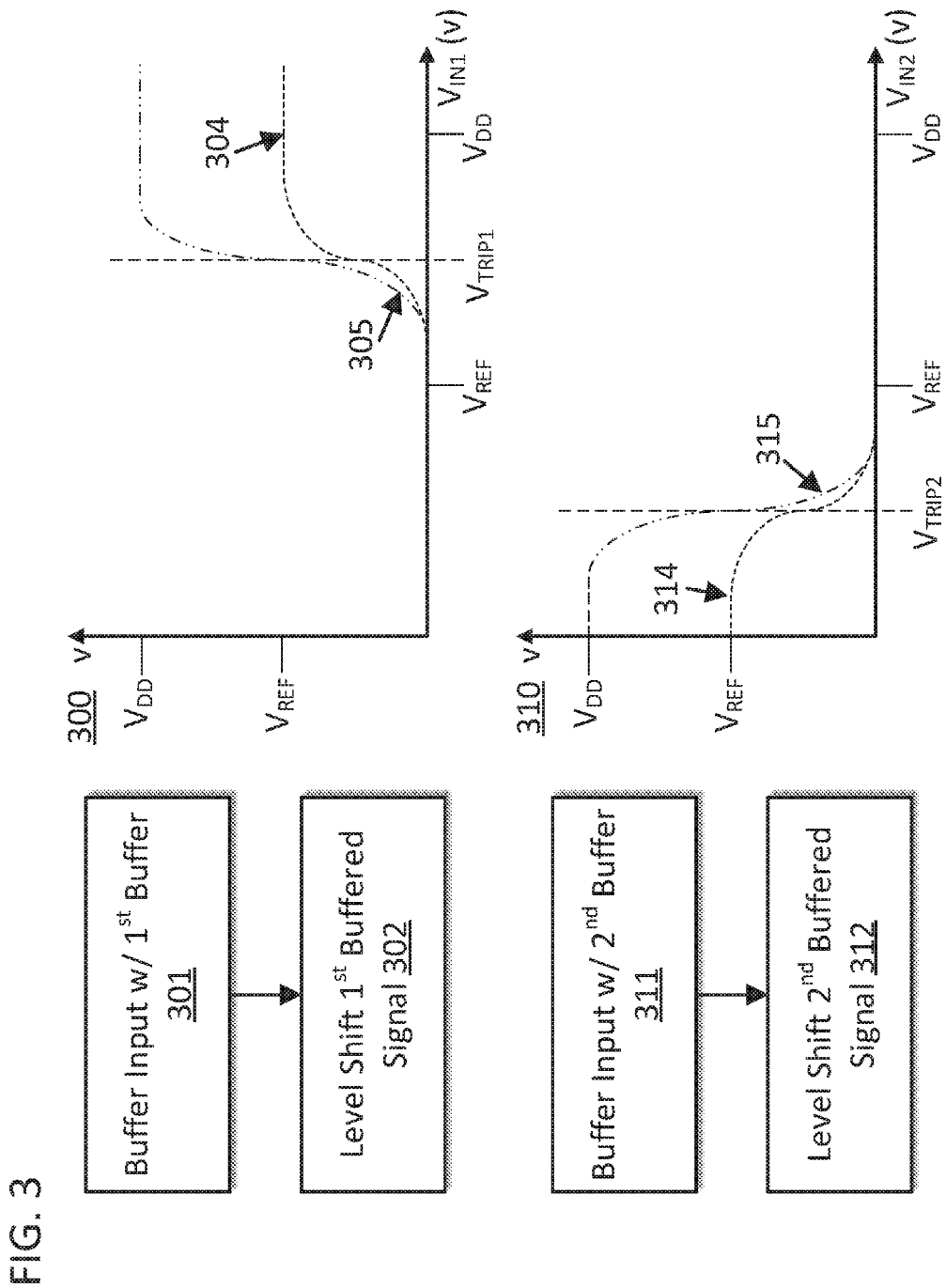
FIG. 3 includes a set of flow charts and two sets of axes to illustrate the operation of the control circuit in FIG. 2.

FIG. 3 includes a set of flow charts and two sets of axes 300 and 310 to illustrate a method of operation for a control circuit. The control circuit could be control circuit 200 from FIG. 2. The waveforms charted on axes 300 align with the specific implementation of FIG. 2 in which the reference voltage $V_{REF}$ is half of the supply voltage $V_{DD}$ and the buffers 201 and 202 are complimentary FET inverters designed to trip at half of their supply voltage. The abscissa of axes 300 is in units of volts and is equal to the value of first input $V_{IN1}$. The abscissa of axes 310 is also in units of volts and is equal to the value of first input $V_{IN2}$. The ordinate of axes 300 is in units of volts and includes a value of $V_{BO1}$ charted as waveform 304 and a value of $V_{BO1LS}$ charted as waveform 305. The ordinate of axes 310 is in units of volts and includes a value of $V_{BO2}$ charted as waveform 314 and a value of $V_{BO2LS}$ charted as waveform 315. The origin of both sets of axes is the ground voltage $V_{GND}$.

In step 301, an input signal is buffered using a first buffer. The first buffer is coupled between a supply voltage and a reference voltage. The first buffer could be first buffer 201 from FIG. 2. In particular, the first buffer could be an inverter powered by the supply voltage $V_{DD}$ and reference voltage $V_{REF}$ and designed to trip at a voltage $V_{TRIP1}$ equal to half of the delta between the voltages that power the inverter. This specific approach is illustrated by the potential values for $V_{BO1}$ charted as waveform 304 on axes 300. As seen, when the first input voltage $V_{IN1}$ approaches and then exceeds the voltage $V_{TRIP1}$, the output voltage of the inverter $V_{BO1}$ transitions from a value of $V_{GND}$ to $V_{REF}$ as the output of the inverter transitions between the voltages that power the inverter.

In step 302, a first buffer output signal is level shifted to a voltage range using a level shifter. The level shifter can be first level shifter 204 from FIG. 2. As illustrated by the potential values for $V_{BO1LS}$ charted as waveform 305 on axes 300, when the output of the first buffer rises to an appreciable degree, the output of the level shifter also rises as it tracks the output of first buffer 201. However, the voltage $V_{BO1LS}$ transitions from a value of $V_{GND}$ all the way to $V_{DD}$. Step 302 can be considered a consequence of step 301 when considered in the time domain because there is a certain time delay between when a transition in the signal provided to the buffer is recognized by the level shifter and reflected by the output of the level shifter. However, the two steps can also be considered to be happening continuously as long as the device is in a standard mode of operation because the signal provided by the first buffer is continuously being level shifted by the first level shifter.

Steps 311 and 312 are similar to steps 301 and 302 respectively. The steps have the same conceptual relationship and conduct the same operation albeit on a different signal to produce a different result. In step 311, an input signal is buffered using a second buffer. The second buffer could be second buffer 202 from FIG. 2. In step 312, a second buffer output signal of the second buffer is level shifter to a voltage range using a second level shifter. The second level shifter could be second level shifter 205 from FIG. 2. The waveforms 314 and 315 correspond to the particular application of control circuit 200 in which second buffer 202 is an inverter having a trip point $V_{TRIP2}$ at roughly half a delta between the voltages that are powering the inverter and that transitions between those two voltages when inverting an input to the inverter. As illustrated, the second inverter output drops as it approaches $V_{TRIP2}$ and the output of the second level shifter tracks and drops with the output of the second inverter. The relative trip points of the inverters and the reference voltage can be adjusted level shifters do not need to be utilizing half steps. In other words, $V_{REF}$ can be biased towards $V_{GND}$ or $V_{DD}$, just as the inverter trip points can be biased towards whichever voltages are being used to power the inverter.

In certain approaches, the signal that is buffered in step 301 and step 311 is a common control signal. To use the example of FIG. 2, a common control signal could be provided to nodes $V_{IN1}$ and $V_{IN2}$. In such an approach, the abscissa of sets of axes 300 and 310 in FIG. 3 both plot the same value. FIG. 3 can be used to illustrate such an application as the x-axis of both sets of axes are aligned and use the same scale. The result of this configuration is a control circuit that takes in a common control signal, and produces three different outputs based on the value of that common control signal. When the common control signal is high (or true) the first output of the control circuit is high (or true) while the second output of the control circuit is low (or false). As seen in FIG. 3, the outputs will have opposite values when the common control signal is low (or false). Finally, when the common control signal is in a given range around $V_{REF}$, the outputs are both low.

The pattern of outputs described in the previous paragraph is amenable to use in the control loop of a switching power converter with at least two switching devices in the switching circuit where the two outputs are used to drive the high and low side switching devices. The terms true and false are used to indicate that it is the relative value of these voltages that are important as the addition of inverters to a circuit path carrying a control signal can assure that the control signal provides the appropriate polarity when that control signal is ultimately used to alter a transistor in the power or control path of a circuit. In other words, true can be high while low is false, but the opposite can also be in keeping with this terminology depending upon the polarity of the control circuit, and the use of the terms true and false is meant to cover both polarities. Regardless, with the aforementioned values, the control circuit produces sufficient output information to provide control signals to a power converter for the three states mentioned above. The control circuit can set either of the switches on independently or shut both of the switches off.

Figure 4:
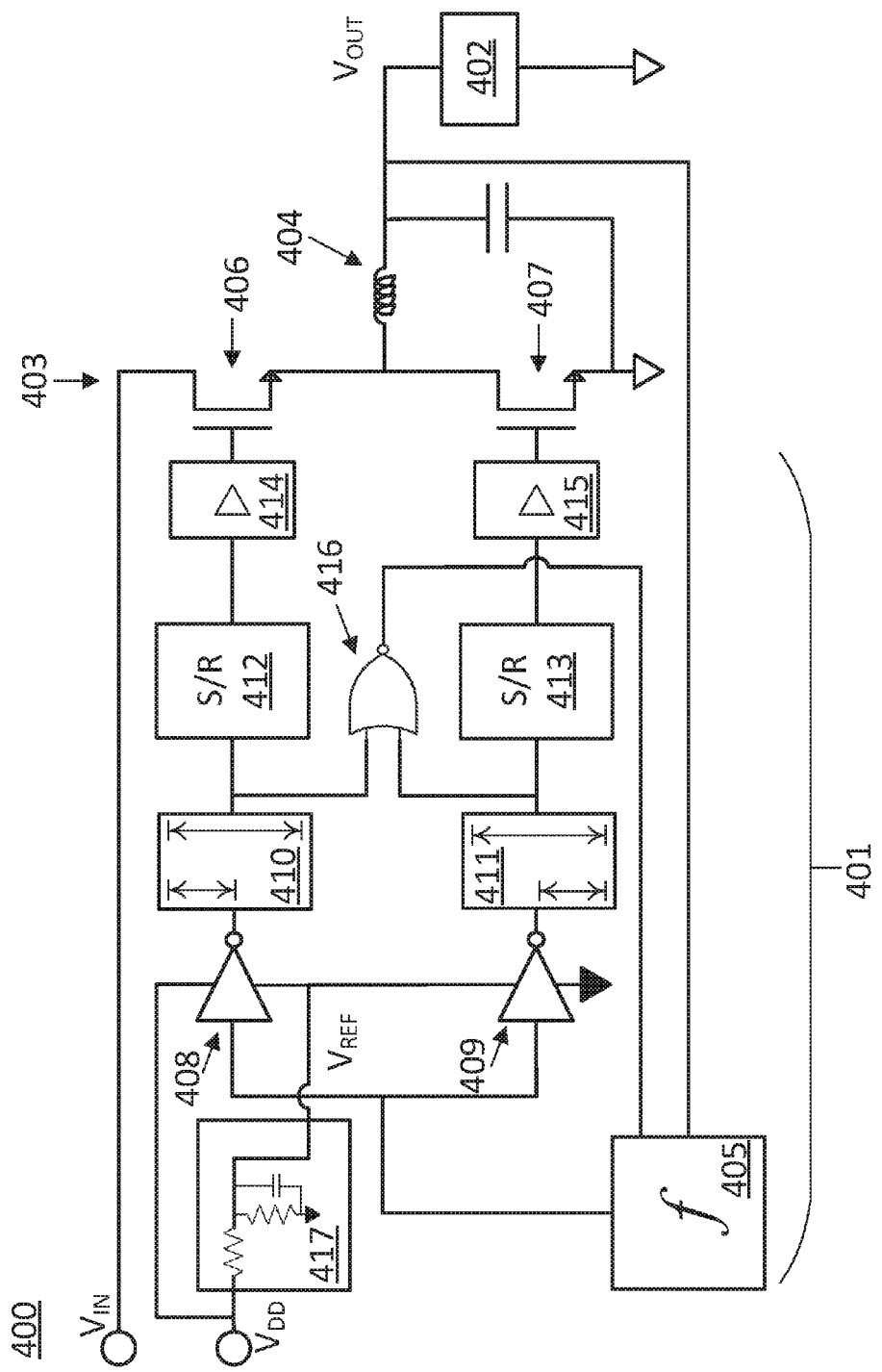
FIG. 4 is a block diagram of a power converter topology that utilizes a control circuit in accordance with embodiments of the present invention.

FIG. 4 illustrates a block diagram of a power converter 400. The power converter includes a control loop 401 that regulates an output of the power converter having load 402 using a switching circuit 403. The switching circuit is coupled between an input side of the power converter and a load side of the power converter. The power converter also includes an output filter 404. The switching circuit 403 can regulate the output voltage $V_{OUT}$ using the input voltage $V_{IN}$ and control loop 401. Control loop 401 includes signal conditioning and processing circuitry 405 and also includes a control circuit that is in accordance with certain implementations of control circuit 200.

The control circuit for power converter 400 includes two branches because it independently controls the control switch 406 and the synchronous switch 407. The control switch 406 can also be referred to as the high side power switch. The synchronous switch 407 can also be referred to as the low side power switch. The two branches split after receiving a common control circuit input from circuitry 405. The two branches include a first buffer 408 with a first input coupled to this common control input, and a second buffer 409 with a second input coupled to this common control input. All of the circuitry on these branches can still be considered on the control loop because they are used to process a control signal that affects the output of the power converter and that was originally based on the output of the power converter. The control loop therefore also includes a first level shifter 410 and a second level shifter 411.

The buffers and level shifters of power converter 400 can match those of the control circuit in control circuit 200. For example, first buffer 408 could be coupled to a supply voltage $V_{DD}$ and a reference voltage $V_{REF}$ and buffer a signal from its input on its output. First buffer 408 could be an inverter powered by supply voltage $V_{DD}$ and reference voltage $V_{REF}$. Likewise, second buffer 409 could be coupled to the reference voltage $V_{REF}$ and a ground voltage $V_{GND}$. Second buffer 409 could be an inverter powered by reference voltage $V_{REF}$ and ground voltage $V_{GND}$. The first and second level shifters 410 and 411 could each be coupled to and powered by supply voltage $V_{DD}$ and ground voltage $V_{GND}$. The level shifters could shift the outputs of the two inverters up to a voltage range. The output of the first level shifter 410 can be referred to as the high side control circuit output. The output of the second level shifter 411 can be referred to as the low side control circuit output. The ground voltage used to bias the buffers and the level shifters can be different than the ground voltage used for switching circuit 403 and load 402. The ground for switching circuit 403 can be referred to as the power ground of the converter while the ground voltage $V_{GND}$ for the control circuitry can be referred to as the control ground or just the ground voltage.

The high side control circuit output and the low side control circuit output can be used to drive high side power transistor 406 and low side power transistor 407 respectively. As illustrated, high side power field effect transistor 406 is coupled to the input side of power converter 400 and low side power field effect transistor 407. Low side power field effect transistor 407 is coupled to high side power field effect transistor 406 and a power ground voltage. As such, level shifters 410 and 411 can be referred to as being used to produce a high side drive signal and a low side drive signal, respectively. The power transistors 406 and 407 can be FETs having gate nodes that receive signals for turning the transistors on or off. As illustrated, the level shifters can produce the signals used to control the power transistors via their gate nodes. The power ground voltage is illustrated as a ground symbol with white fill to distinguish it from the control circuit ground which is illustrated as a ground symbol with black fill.

The control and drive circuitry between the level shifters and the power transistors may vary. FIG. 4 includes one approach in which the control circuit output signals are latched and then provided to gate drive circuits. Additional circuitry has been omitted for simplicity and other approaches are possible. In the illustrated approach, the high side control circuit output and the low side control circuit output may be latched. For example, the high side control circuit output can be latched by S/R latch 412, a high side latch communicatively coupled to the high side gate driver 414 and the first level shifter 410, wherein the high side latch latches the high side drive signal. The low side control circuit output can be latched by S/R latch 413, a low side latch communicatively coupled to the low side gate driver 415 and the second level shifter 411, wherein the low side latch latches the low side drive signal.

The output of latches 412 and 413 could be independently provided to respective gate drivers 414 and 415. The gate drivers could be large stacked complimentary FETs. The gate drivers may be powered by another set of supply voltages in order to rapidly and properly switch the control gate of the control switches despite variations in $V_{IN}$ and power ground. The high side gate driver 414 could be powered by a boosted voltage supply and coupled to the high side gate node of power transistor 406. The high side gate driver 414 drives the high side power field effect transistor 406 using the high side drive signal. The low side gate driver 415 could be biased by the power ground voltage and coupled to the low side gate node of power transistor 407. The low side gate driver 415 drives the low side power field effect transistor 407 using the low side drive signal.

The reference voltage $V_{REF}$ could be greater than one quarter of the supply voltage $V_{DD}$ and less than three quarters of the supply voltage $V_{DD}$. As a result, and assuming buffers 408 and 409 were designed to trip at the midpoint between their supply voltages, the combined transfer function of the control circuit would be similar to that obtained by combining waveforms 305 and 315 on a single x-axis. At a low voltage, only the low side power transistor 407 is on while the high side is off, at a midpoint both the high side power transistor 406 and low side power transistor 407 are off, at a high voltage, only the high side power transistor 406 is on. Indeed, $V_{REF}$ could be selected to be approximately half of $V_{DD}$ and each buffer 408 and 409 could be configured to trip at half of a delta between its supply voltages. In this case, the spacing of the trip voltages is maximized across the range of potential $V_{IN}$ values to reduce noise susceptibility.

If a control circuit such as control circuit 200 is utilized in a switched power converter, the status signal $V_{STAT}$ can be used to indicate that the control circuit is driving the power converter to tristate. A logic circuit can be communicatively coupled to the high side and low side control circuit outputs to detect when those signals are shutting off both the high side and low side power transistors 406 and 407. This logic circuit will use those signals to produce a trilevel output signal. The trilevel output signal can then be used to inform alternative portions of the power converter that the power converter is in tristate. For example, certain portions of the control loop signal processing circuitry may need to be placed into a different mode while the device is in tristate, and the trilevel output signal can be used to initiate this change in mode.

FIG. 4 provides an example of how a trilevel output signal can be produced. As illustrated, power converter 400 includes a logic circuit 416 that is communicatively coupled to the high side control circuit output and the low side control circuit output. In the figure, logic circuit 416 is a basic NOR gate and is directly coupled to the outputs of level shifters 411 and 410. However, the logic circuit can be more complex and additional logic gates and circuitry can be placed between the outputs of the level shifters and the inputs of the logic circuit so long as they remain communicatively coupled and the information content of the high side and low side drive control circuit output signals are not modified before reaching the input of the logic circuit. In the illustrated example, the logic circuit output will be high when both of the control circuit output signals are low. However, the relative polarity of these signals will depend upon the presence of additional circuitry between the switching circuit and the characteristics of the switching circuits themselves. Assuming that "true" value for a control circuit output signal activates its respective switching device, the trilevel output signal of the logic circuit output should be true when both the high and low side control circuit outputs are false. In the illustrated example, the trilevel output signal will also be true when the common control circuit input equals the reference voltage $V_{REF}$.

FIG. 4 also provides an example of how the reference voltage can be generated from the supply voltage $V_{DD}$ and ground voltage $V_{GND}$. As illustrated, power converter 400 includes a reference voltage generator 417. The reference voltage generator can be integrated with the control circuitry and formed in the same physical structure as the control circuitry (e.g., the reference voltage generator can be in the same integrated circuit as the control circuitry). The reference voltage generator is shown coupled between the supply voltage $V_{DD}$ and the ground voltage $V_{GND}$. Notably, the ground voltage is the control circuitry ground instead of the power ground and hence is illustrated by a ground icon with black fill. The illustrated reference voltage generator includes an impedance divider that generates the reference voltage from the supply voltage. The reference voltage generator may need to be augmented with a reference voltage generator capacitor in order to assure that it can serve as a rail for the first buffer 408 and second buffer 409. The buffers need to switch very quickly and may pull a large amount of current, but in order for the buffers to perform adequately, the voltage on the rail should not change substantially when the current is drawn. In certain applications, the reference voltage generator capacitor should be at least 1.5 picofarads in order to assure that the rails of the buffers are adequately regulated.

Figure 5:
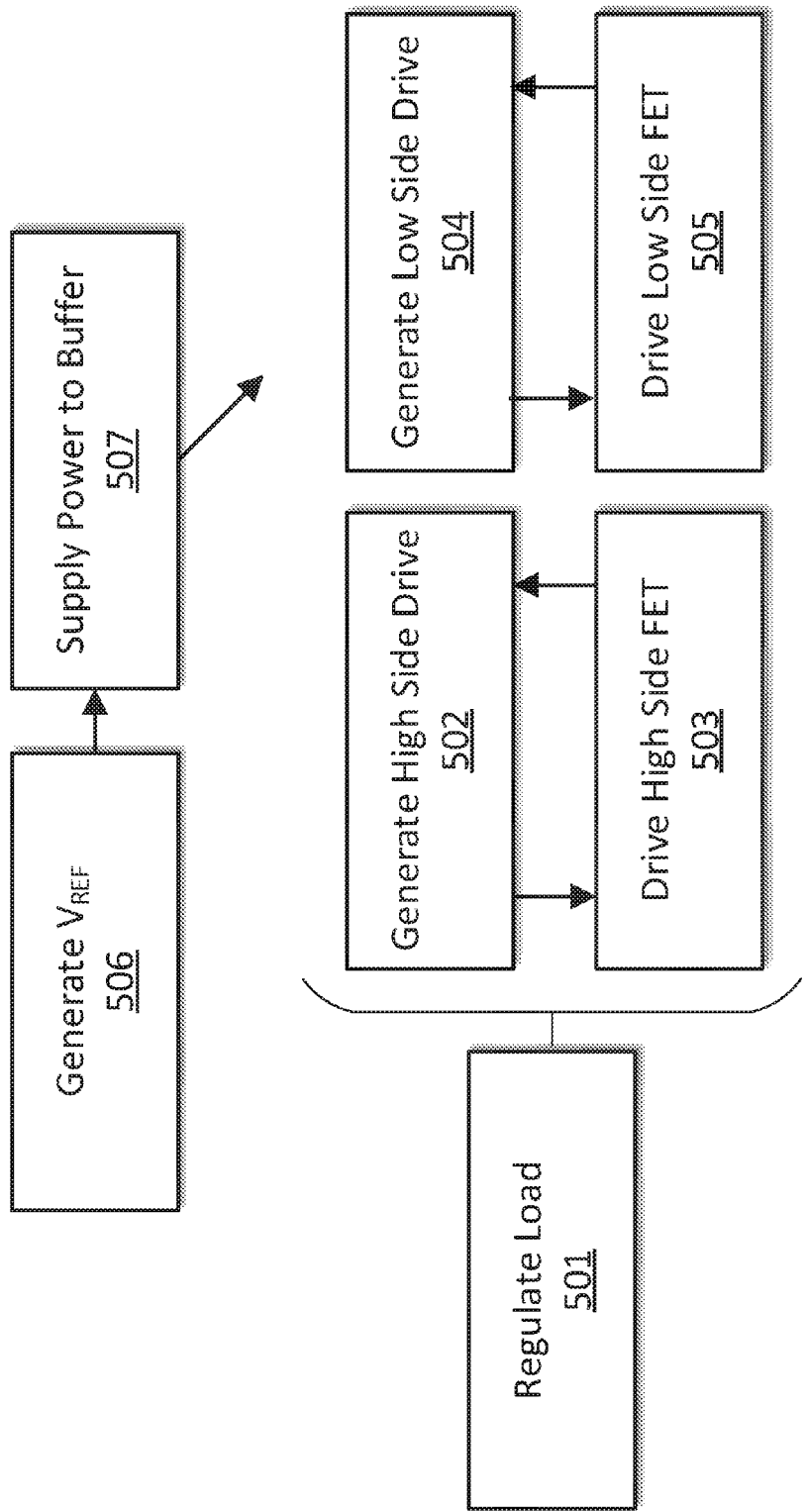
FIG. 5 includes a set of flow charts to illustrate methods of operating a power converter in accordance with embodiments of the present invention.

FIG. 5 includes a flow chart 500 of a set of methods for controlling a power converter. The power converter could be power converter 400 in FIG. 4. In step 501, a load is regulated using a high side power FET, a low side power FET, and a control loop. Steps 502-505 are conducted in combination in order to maintain the power converter in a standard operating mode in which the output of the power converter is regulated. In step 502, a high side drive signal is generated via at least the level shifting of a first buffer output signal. The high side drive signal could be level shifted by level shifter 410 and the first buffer output signal could be the output of first buffer 408. In step 503, the high side drive signal generated in step 502 could be used to drive a high side power FET. The high side power FET could be control switch 406 and the FET could be driven via circuitry communicatively coupling level shifter 410 with the gate node of control switch 406. Steps 502 and 503 can be conceptualized as occurring in sequence when considering the effect of a transition in the drive signal. As such, the steps are shown with arrows connecting them in a looping fashion. Steps 504 and 505 are similar to steps 502 and 503 except that they deal with the low side power FET, the low side drive signal, and all of the accompanying circuitry. Steps 504 and 505 are drawn in parallel with steps 502 and 503 to indicate that the steps can be happening in tandem with a transition in the high side drive signal being matched by a transition in the low side drive signal.

FIG. 5 also includes steps 506 and 507 to explain the operation of the reference voltage generator. In step 506, the reference voltage generator is used to generate $V_{REF}$ from a supply voltage. In step 507, power is supplied to the second buffer using a reference voltage generator capacitor. The reference voltage generator can be reference voltage generator 417 from FIG. 4. Step 507 is drawn with an arrow towards step 504 and 505 to indicate that the power supplied by this step can be used to drive low side FET 407.

Figure 6:
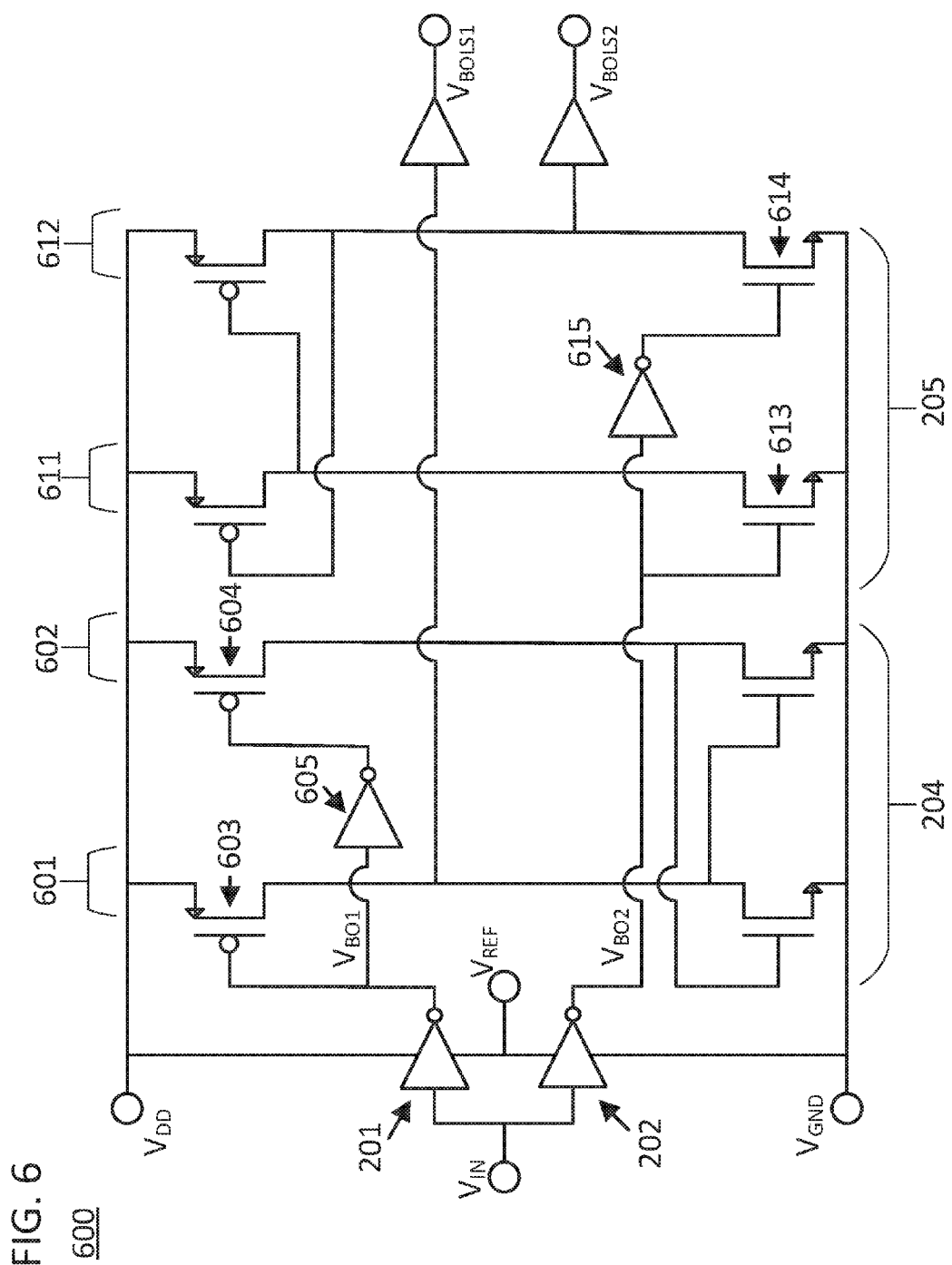
FIG. 6 is a block diagram of a specific implementation of the control circuit of FIG. 2.

FIG. 6 illustrates a control circuit 600 that serves as a specific implementation of the control circuit in FIG. 2. Control circuit 600 utilizes a common control input $V_{IN}$ coupled to both the first buffer 201 and second buffer 202 from control circuit 200. Control circuit 600 can also be used in combination with power converter 400 in FIG. 4. The common input signal can be the main signal used by the control loop of the power converter to regulate the load. In particular, the common control input $V_{IN}$ could be a PWM signal on the control loop of a switched power converter that is used for driving the switching circuit of the power converter. The illustrated implementations of first level shifter 204 and second level shifter 205 are similar in structure except the input signal for second level shifter 205 is provided to the control gates of a set of n-type devices while the input signal for first level shifter 204 is provided to the control gates of a set of p-type devices. This is because first level shifter 204 shares $V_{DD}$ in common with the input voltage range from buffer 201 while second level shifter 205 shares $V_{GND}$ in common with the input voltage range from buffer 202.

The first and second level shifters each individually comprise certain features that are common to both of their topologies. Both level shifters include a first circuit branch (601, 611) coupled between the supply voltage $V_{DD}$ and the ground voltage $V_{GND}$. They also both include a first field effect transistor (603, 613) located on this circuit branch with a first control gate. Both level shifters also include a second circuit branch (602, 612) and a second field effect transistor (604, 614) located on the second circuit branch having a second control gate. Furthermore, both level shifters include an internal inverter (605, 615) with an input coupled to the first control gate and an output coupled to the second control gate. The term "internal" is used herein to indicate that the inverter is within the same functional circuit block as the level shifter and is therefore "internal" to the level shifter from a schematic level perspective. However, inverters 605 and 615 may not differ in great respect to buffers 201 and 202 with respect to their physical layout with exceptions made for standard decisions like the placement of cells in a layout close to where their signals are required.

The trip point of level shifter 204 is set by the threshold voltage of transistor 603 and the trip point of internal inverter 605. The trip point of level shifter 205 is set by the threshold voltages of transistor 613 and the trip point of internal inverter 615. These transistors can be sized to place the trip point between the reference voltage and the rail that is shared with the first buffer 201 or second buffer 202 respectively for level shifters 204 and 205. In specific approaches, as described above, this trip point can be offset from the reference voltage by half of the delta between the reference voltage and the shared rail. The level shifters will switch quickly at their trip points. Also, since the topologies of the converters are complementary each can perform suitably for its given trip point instead of stretching the same topology to perform under either condition. The result is a rapid transition in the high side control circuit output at $V_{BOLS1}$ and the low side control circuit output at $V_{BOLS2}$ in response to two separate voltages between $V_{DD}$ and $V_{GND}$ creating a tri-level input control circuit. As mentioned previously a logic circuit could be coupled to $V_{BOLS1}$ and $V_{BOLS2}$ to generate a status signal when the circuit was in tristate.

The status signal generated by control circuit can alter a characteristic of the control loop of the power converter. As mentioned previously, the status signal could be indicative of a tristate in which all of the switches in the switching circuit of the power converter were turned off. The control loop may need to be altered in this state. This is illustrated in FIG. 4 by the connection between logic circuit 416 and signal conditioning and processing circuitry 405. However, it may be necessary to assure that the power converter is truly in tristate and not just rapidly transitioning between the two standard on/off and off/on states. Since the high side control circuit output and the low side control circuit output independently transition as the common input voltage $V_{IN}$ transitions from true to false, there may be a point where both signals are temporarily false. This would likely occur at the point that the common input signal was around the reference voltage $V_{REF}$. A delay circuit can be used to distinguish between a transition between the two standard states of the control circuit, and a true transition into tristate.

Figure 7:
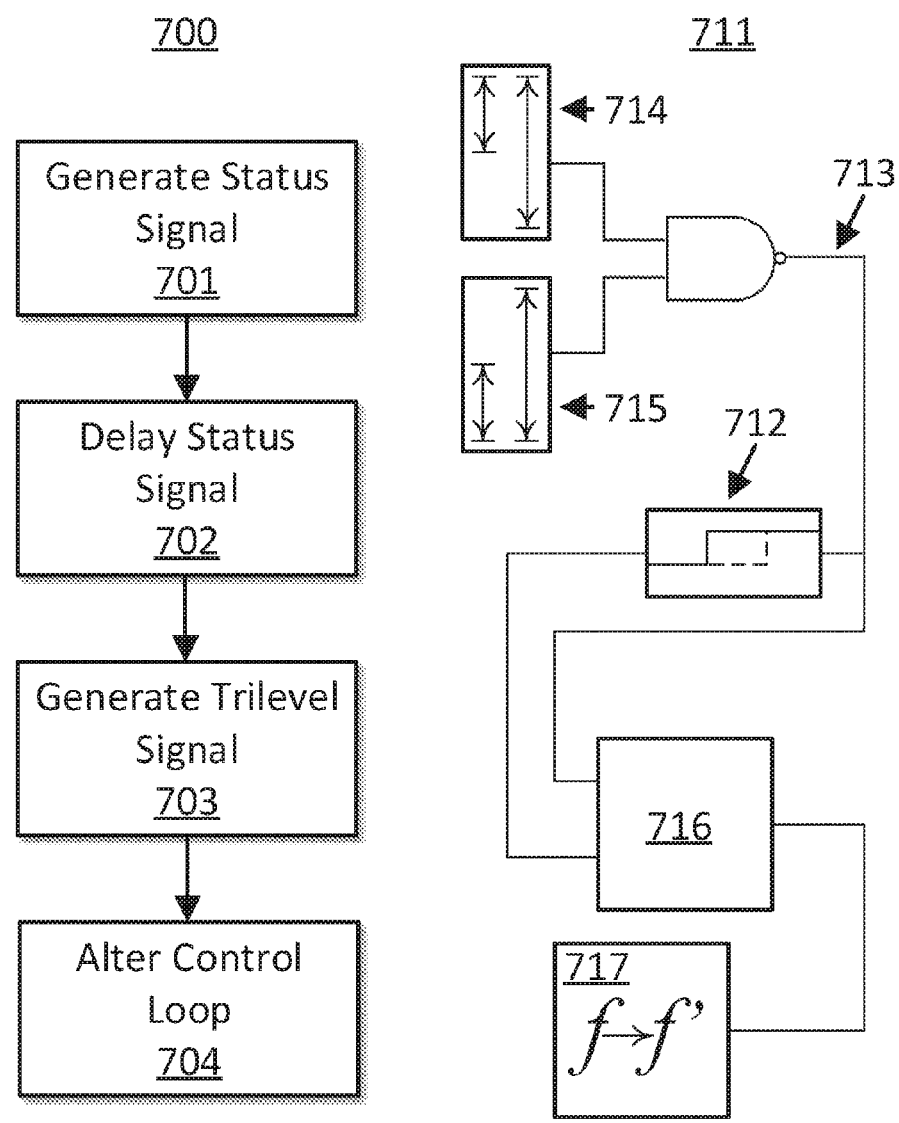
FIG. 7 includes a flow chart and block diagram to illustrate the generation of a status signal by a control circuit in accordance with embodiments of the present invention.

FIG. 7 includes a flow chart 700 and a block diagram 711 to illustrate the use of a delay circuit 712 to detect a true transition into tristate. As illustrated, delay circuit 712 is coupled to logic circuit output 713. The accompanying method can begin with step 701 of generating a status signal on a logic circuit output 713 using a logic circuit. The logic circuit can be communicatively coupled to a first level shifter 714 and a second level shifter 715 which could be the level shifters of the control circuits described previously. Step 702 can involve delaying the logic circuit output using a delay circuit. Step 703 can involve generating a trilevel output signal if the delayed logic circuit output stays true for greater than the delay time. A circuit for achieving this result is illustrated by latching circuit 716 and delay circuit 712. The trilevel output signal can then be used to alter a characteristic of the control loop using the trilevel output signal as in step 704 and as illustrated by block 717. The delay of the delay circuit can be at least 5 nanoseconds. Given that transitions between standard states can occur on the order of 1-2 nanoseconds this level of delay can be sufficient to screen out true transitions into tristate from temporary transitions through tristate.

While the specification has been described in detail with respect to specific embodiments of the invention, it will be appreciated that those skilled in the art, upon attaining an understanding of the foregoing, may readily conceive of alterations to, variations of, and equivalents to these embodiments. Any of the method steps discussed above can be conducted by a processor operating with a computer-readable non-transitory medium storing instructions for those method steps. Although examples in the disclosure where directed to switching power converters that provided a fixed voltage to a regulated regime, the same approaches can be applied to power converters that provide a fixed current to a regulated regime. In the provided examples, the polarity of reference, ground, and signal carrying voltages can be switched in whole or in part to achieve similar results. For example, a logic low and logic high could be switched provided an additional inverter was added to the system or provided the entire system switched. Furthermore, although examples in the disclosure were directed switching converters the approaches disclosed herein apply to any power converter scheme that transitions between operating modes and includes a control loop. These and other modifications and variations to the present invention may be practiced by those skilled in the art, without departing from the scope of the present invention, which is more particularly set forth in the appended claims.

What is claimed is:

1. A control circuit comprising:
    a first buffer powered by a supply voltage and a reference voltage, wherein the first buffer buffers a first input on a first output;
    a second buffer powered by the reference voltage and a ground voltage, wherein the second buffer buffers a second input on a second output;
    a first level shifter, wherein the first level shifter shifts the first output to a voltage range; and
    a second level shifter, wherein the second level shifter shifts the second output to the voltage range;
    wherein the voltage range is larger than a delta between the supply voltage and the reference voltage; and
    wherein the reference voltage is greater than one quarter of the supply voltage and less than three quarters of the supply voltage.

2. The control circuit of claim 1, wherein:
    the first level shifter is powered by the supply voltage and the ground voltage; and
    the second level shifter is powered by the supply voltage and the ground voltage.

3. The control circuit of claim 2, wherein the first and second level shifters each individually comprise:
    a first circuit branch coupled between the supply voltage and the ground voltage;
    a first field effect transistor located on the first circuit branch and having a first control gate;
    a second circuit branch coupled between the supply voltage and the ground voltage;
    a second field effect transistor located on the second circuit branch and having a second control gate; and
    an internal inverter having an internal inverter input coupled to the first control gate and an internal inverter output coupled to the second control gate.

4. The control circuit of claim 1, further comprising:
    a common control circuit input, wherein the common control circuit input is coupled to the first input and the second input;
    a high side control circuit output, wherein an output of the first level shifter is the high side control circuit output; and
    a low side control circuit output, wherein an output of the second level shifter is the low side control circuit output.

5. The control circuit of claim 4, further comprising:
    a logic circuit communicatively coupled to the high side control circuit output and the low side control circuit output; and
    a logic circuit output of the logic circuit that is used to produce a trilevel output signal;
    wherein the logic circuit output is true when the high side control circuit output and the low side control circuit output are both false.

6. The control circuit of claim 1, wherein the first buffer and the second buffer each individually comprise:
    a two-device complementary field effect transistor ("FET") inverter;
    wherein the two-device complementary FET inverter of the first buffer trips at about one half of a delta between the supply voltage and the reference voltage; and
    wherein the two-device complementary FET inverter of the second buffer trips at about one half of a delta between the reference voltage and the ground voltage.

7. The control circuit of claim 6, wherein:
    the two-device complementary FET inverter of the first buffer trips when the first input is equal to about three quarters of the supply voltage; and
    the two-device complementary FET inverter of the second buffer trips when the second input is equal to about one quarter of the supply voltage.

8. A power converter comprising:
    a control loop that regulates an output of the power converter using a switching circuit, wherein the switching circuit is coupled between an input side of the power converter and a load side of the power converter;
    a first buffer powered by a supply voltage and a reference voltage, wherein the first buffer buffers a first input on a first output;
    a second buffer powered by the reference voltage and a ground voltage, wherein the second buffer buffers a second input on a second output;
    a first level shifter, wherein the first level shifter shifts the first output to a voltage range; and
    a second level shifter, wherein the second level shifter shifts the second output to the voltage range;
    wherein the first level shifter and the second level shifter are on the control loop;
    wherein the voltage range is larger than a delta between the supply voltage and the reference voltage; and
    wherein the reference voltage is greater than one quarter of the supply voltage and less than three quarters of the supply voltage.

9. The power converter of claim 8, further comprising:
    the first level shifter is powered by the supply voltage and the ground voltage; and
    the second level shifter is powered by the supply voltage and the ground voltage.

10. The power converter of claim 8, wherein the switching circuit further comprises:
    a high side power field effect transistor with a high side gate node; and
    a low side power field effect transistor with a low side gate node;
    wherein the high side power field effect transistor is coupled to the input side of the power converter and the low side power field effect transistor;
    wherein the low side power field effect transistor is coupled to the high side power field effect transistor and a power ground voltage;
    wherein the first level shifter produces a high side drive signal for the high side gate node; and
    wherein the second level shifter produces a low side drive signal for the low side gate node.

11. The power converter of claim 10, further comprising:
    a high side gate driver circuit powered by a boosted voltage supply, and coupled to the high side gate node, wherein the high side gate driver drives the high side power field effect transistor using the high side drive signal;

a low side gate driver circuit biased by the power ground voltage, and coupled to the low side gate node, wherein the low side gate driver drives the low side power field effect transistor using the low side drive signal;

a high side latch communicatively coupled to the high side gate driver and the first level shifter, wherein the high side latch latches the high side drive signal; and a low side latch communicatively coupled to the low side gate driver and the second level shifter, wherein the low side latch latches the low side drive signal.

12. The power converter of claim 10, further comprising:

a common control circuit input on the control loop, wherein the common control circuit input is coupled to the first input and the second input;

wherein the high side drive signal and the low side drive signal are both based on a first pulse width modulated signal received on the common control circuit input; and wherein the high side drive signal and the low side drive signal are second and third pulse width modulated signals.

13. The power converter of claim 12, wherein:

a logic circuit communicatively coupled to the first level shifter and the second level shifter; and a logic circuit output of the logic circuit that is used to produce a trilevel output signal;

wherein the high side power field effect transistor and the low side power field effect transistor are both turned off when the logic circuit output is true.

14. The power converter of claim 12, wherein the first and second level shifters each individually comprise:

a first circuit branch coupled between the supply voltage and the ground voltage;

a first field effect transistor located on the first circuit branch and having a first control gate;

a second circuit branch coupled between the supply voltage and the ground voltage;

a second field effect transistor located on the second circuit branch and having a second control gate; and an internal inverter having an internal inverter input coupled to the first control gate and an internal inverter output coupled to the second control gate.

15. A method comprising:

buffering an input signal using a first buffer, wherein the first buffer is powered by a supply voltage and a reference voltage;

buffering the input signal using a second buffer, wherein the second buffer is powered by the reference voltage and a ground voltage;

level shifting a first buffer output signal of the first buffer to a voltage range using a first level shifter; and level shifting a second buffer output signal of the second buffer to the voltage range using a second level shifter;

wherein the voltage range is larger than a delta between the supply voltage and the reference voltage; and wherein the reference voltage is greater than one quarter of the supply voltage and less than three quarters of the supply voltage.

16. The method of claim 15, further comprising:

regulating a load using a high side power field effect transistor, a low side power field effect transistor, and a control loop;

generating a high side drive signal via at least the level shifting of the first buffer output signal;

generating a low side drive signal via at least the level shifting of the second buffer output signal;

driving the high side power field effect transistor using the high side drive signal; and driving the low side power field effect transistor using the low side drive signal;

wherein the input signal is on the control loop.

17. The method of claim 16, further comprising:

generating a logic circuit output using a logic circuit, wherein the logic circuit is communicatively coupled to the first level shifter and the second level shifter;

delaying the logic circuit output using a delay circuit with a delay of at least 5 nanoseconds to produce a delayed logic circuit output;

generating a trilevel output signal if the delayed logic circuit output stays true for greater than 5 nanoseconds;

altering a characteristic of the control loop using the trilevel output signal.

* * * * *